United States Patent
Lee et al.

(10) Patent No.: US 8,258,856 B2
(45) Date of Patent: Sep. 4, 2012

(54) ANTIFUSE CIRCUIT HAVING PROTECTION CIRCUIT

(75) Inventors: Cheon-An Lee, Hwaseong-si (KR); Seong-Jin Jang, Seongnam-si (KR); Sang-Woong Shin, Seongnam-si (KR)

(73) Assignee: Samsung Electronics Co., Ltd., Suwon-Si, Gyeonggi-Do (KR)

(*) Notice: Subject to any disclaimer, the term of this patent is extended or adjusted under 35 U.S.C. 154(b) by 283 days.

(21) Appl. No.: 12/619,280

(22) Filed: Nov. 16, 2009

(65) Prior Publication Data

US 2010/0134175 A1 Jun. 3, 2010

(30) Foreign Application Priority Data

Dec. 3, 2008 (KR) .................. 10-2008-0121753

(51) Int. Cl.
*G11C 17/18* (2006.01)
*G11C 17/16* (2006.01)

(52) U.S. Cl. .......................... 327/525; 365/96
(58) Field of Classification Search .................. None
See application file for complete search history.

(56) References Cited

U.S. PATENT DOCUMENTS

| | | | | |
|---|---|---|---|---|
| 6,128,241 A * | 10/2000 | Choi | .......... | 365/225.7 |
| 6,240,033 B1 | 5/2001 | Yang et al. | | |
| 6,724,238 B2 * | 4/2004 | Derner et al. | .......... | 327/525 |
| 7,236,043 B2 * | 6/2007 | Wich et al. | .......... | 327/525 |
| 2001/0030570 A1 | 10/2001 | Kim et al. | | |
| 2008/0043557 A1 | 2/2008 | Ko | | |

FOREIGN PATENT DOCUMENTS

| | | |
|---|---|---|
| JP | 2000-208637 | 7/2000 |
| KR | 10-0317490 | 11/2001 |
| KR | 10-0654126 | 11/2006 |
| KR | 10-0746230 | 7/2007 |

OTHER PUBLICATIONS

English Abstract for Publication No. 2000-208637.
English Abstract for Publication No. 1020010065144 (for 10-0317490).
English Abstract for Publication No. 1020000062452 (for 10-0654126).
English Abstract for Publication No. 10-0746230.

* cited by examiner

*Primary Examiner* — Lincoln Donovan
*Assistant Examiner* — Terry L Englund
(74) *Attorney, Agent, or Firm* — F. Chad & Associates, LLC

(57) ABSTRACT

An antifuse circuit includes a protection circuit. The antifuse circuit receives a program voltage using a non-connection (NC) pin or ball of a semiconductor device. The protection circuit prevents an unintended voltage lower than the program voltage from being applied to the antifuse circuit.

17 Claims, 3 Drawing Sheets

ANTIFUSE CIRCUIT HAVING PROTECTION CIRCUIT

CROSS-REFERENCE TO RELATED APPLICATION

This application claims the benefit of Korean Patent Application No. 10-2008-0121753, filed Dec. 3, 2008, the contents of which are hereby incorporated herein by reference in their entirety.

BACKGROUND

1. Technical Field

Exemplary embodiments of the present inventive concept relate to an antifuse circuit, and more particularly, to an antifuse circuit having a protection circuit.

2. Discussion of Related Art

Faulty semiconductor devices are generally repaired using a conventional fuse at a wafer level. Thus, when a failure of the semiconductor device is detected after completion of a packaging process, a repair operation cannot be carried out. Accordingly, an antifuse has been introduced so that a repair operation can be performed even after the packaging process has completed.

In general, an antifuse device may have opposite electrical properties to those of a fuse device. For example, where a fuse device will sever an electrical connection upon the receiving of a sufficient current, the antifuse device will establish an electrical connection upon the receiving of a sufficient current. The state in which the antifuse device does not permit the flow of electricity is known as the "unprogrammed" state while the state in which the antifuse device permits the flow of electricity is known as the "programmed" state. An antifuse may be a resistive fuse device, which has a high resistance of, for example, about 100 MΩ, in an unprogrammed state and has a low resistance of, for example, about 100 KΩ or lower, in a programmed state. The antifuse may typically include conductive materials and a dielectric material interposed therebetween. The antifuse may be programmed by applying a program voltage, for example, a high voltage of about 5V, to the conductive materials corresponding to both terminals of the antifuse for a sufficient time to destruct the dielectric material interposed between the conductive materials. As a result, when the antifuse is programmed, an electrical short may occur between the conductive materials corresponding to both terminals of the antifuse, thereby reducing the resistance of the antifuse.

SUMMARY

Exemplary embodiments of the present inventive concept provide an antifuse circuit having a protection circuit.

According to exemplary embodiments of the present inventive concept, an antifuse circuit includes a protection circuit including a first protection unit connected between a first pad and a common node, and configured to apply a program voltage to the common node when the program voltage higher than a boost voltage is applied through the first pad and prevent application of a voltage lower than the boost voltage to the common node when the voltage lower than the boost voltage is applied to the first pad. The antifuse circuit includes at least one antifuse unit. The antifuse circuit is configured to program the antifuse units in response to a selection signal and a program mode signal in a program mode and output an output signal according to a program state of the antifuse units in a normal mode.

The first protection unit may include a PMOS transistor connected between the first pad and the common node and having a gate to which the boost voltage is applied, and a diode connected between a body of the PMOS transistor and a power supply voltage lower than the boost voltage.

The PMOS transistor may include a p-type substrate, an n-type well disposed in a predetermined region of the p-type substrate, a p-type source and drain disposed in a predetermined region of the n-type well and spaced apart from each other, an n-type well electrode disposed in a predetermined region of the n-type well and spaced apart from the p-type source and drain and connected to a cathode of the diode, a dielectric material disposed on the p-type substrate between the p-type source and drain. The gate is disposed on the dielectric material and configured to receive the boost voltage.

The protection circuit may further include a second protection unit connected between a second pad and the common node, and configured to apply a ground voltage to the common node in response to an inverted program mode signal in the normal mode and prevent application of the ground voltage to the common node in the program mode.

The second protection unit may include two NMOS transistors serially connected between the second pad and the common node and configured to receive the boost voltage and the inverted program mode signal, respectively.

The first pad may be connected to a non-connection (NC) pin or NC ball of a semiconductor device including the antifuse circuit. The second pad may be connected to a ground (GND) pin or GND ball configured to apply a ground voltage to the semiconductor device.

Each of the at least one antifuse unit may include a fuse unit having an antifuse connected between the common node and a first node, and configured to be enabled in response to a program selection signal, which is enabled in response to the program mode signal and the corresponding selection signal, and to program the antifuse in response to the program voltage applied to the common node to set a voltage level of a fuse node, a switch transistor configured to connect the fuse node with a latch node in response to a power-up signal, and a latch unit configured to be enabled in response to a power stabilization signal, and latch and output the output signal in response to a voltage level of the latch node.

BRIEF DESCRIPTION OF THE DRAWINGS

The above and other features and aspects of the exemplary embodiments of the present inventive concept are described in further detail below with reference to the accompanying drawings. It should be understood that various aspects of the drawings may have been exaggerated for clarity.

DETAILED DESCRIPTION OF THE EXEMPLARY EMBODIMENTS

Figure 1:
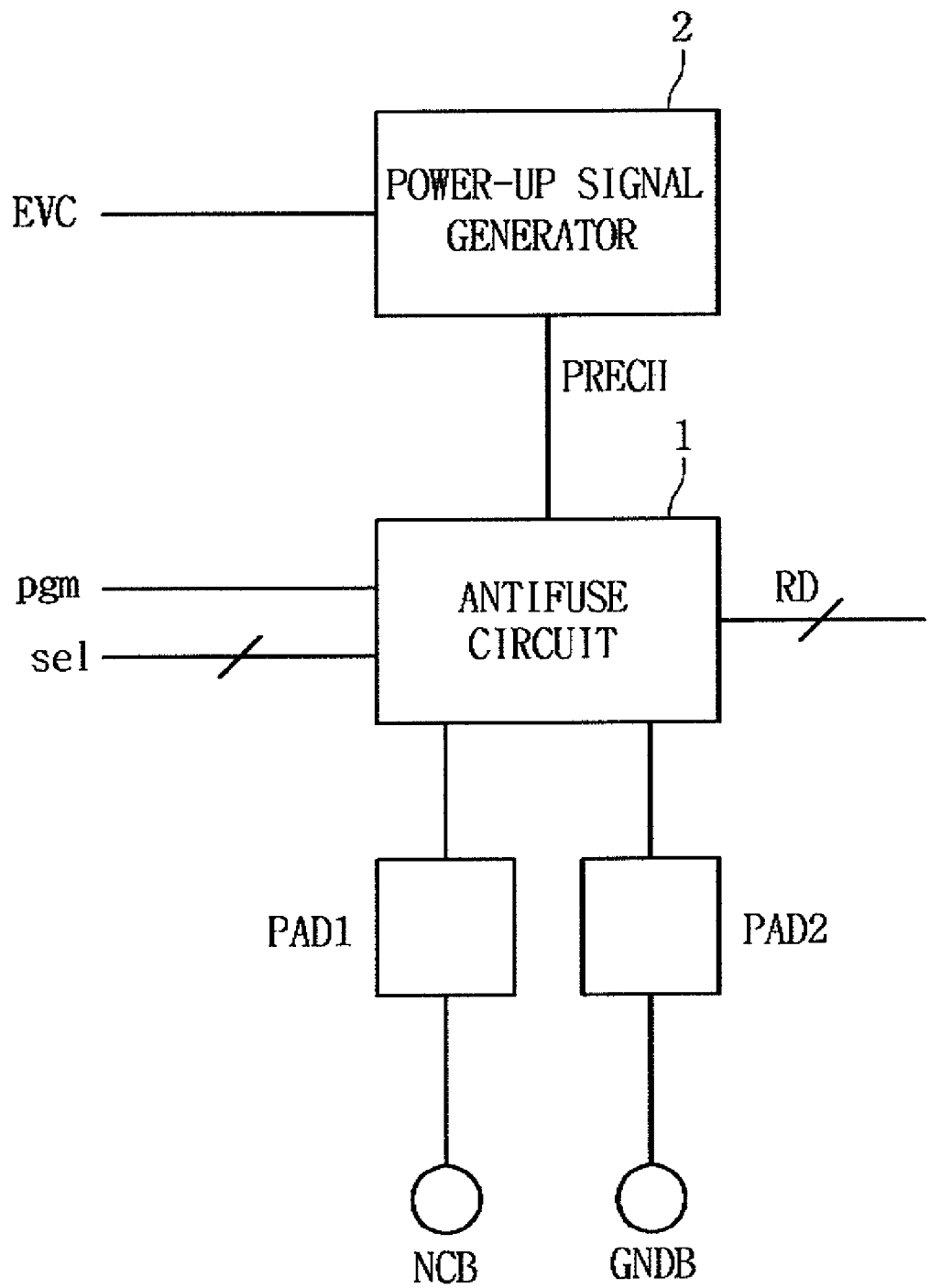
FIG. 1 is a diagram of a semiconductor device having an antifuse circuit according to exemplary embodiments of the present inventive concept.

Various exemplary embodiments of the present inventive concept will now be described more fully with reference to the accompanying drawings. The inventive concept may, however, be embodied in many different forms and should not be construed as being limited to the exemplary embodiments set forth herein. In the drawings, the thicknesses of layers and regions may be exaggerated for clarity. It will also be understood that when a layer is referred to as being "on" another layer or substrate, it can be directly on the other layer or substrate, or intervening layers may also be present. Like reference numerals in the drawings may denote like elements, and thus their description may be omitted.

A power supply voltage may be boosted using a voltage boost circuit and the boosted voltage may then be used as a program voltage for programming an antifuse in a semiconductor device. However, power supply voltages used with modern semiconductor devices are relatively low. Thus, the size of the voltage boost circuit to generate a high program voltage in the semiconductor device may be increased. As a result, a chip size may be increased. Also, since the boosted program voltage is required to program the antifuse but is not needed to program standard memory cells, it may be inefficient to embed the voltage boost circuit in the semiconductor device to generate the program voltage. Accordingly, it may be preferable to receive the program voltage from an external apparatus instead of generating the program voltage from within the semiconductor device.

In general, a semiconductor device may be connected to an external apparatus using a plurality of pins or balls according to the type of a package. Also, the semiconductor device may include a predetermined number of pins or balls (e.g., one pin or ball) of the plurality of pins or balls as non-connection (NC) pins or balls. The NC pins or balls are extra pins or balls that are not used during a normal operation of the semiconductor device. Therefore, a semiconductor device having an antifuse circuit according to exemplary embodiments of the present inventive concept may be simply configured such that the antifuse circuit receives a program voltage through an NC pin or NC ball. For brevity, it is assumed that a semiconductor device according to exemplary embodiments of the present inventive concept is a ball-grid-array (BGA) package including an NC ball.

FIG. 1 is a diagram of a semiconductor device including an antifuse circuit according to an exemplary embodiment of the present inventive concept.

Referring to FIG. 1, the semiconductor device having an antifuse may include an antifuse circuit 1, a power-up signal generator 2, and first and second pads PAD1 and PAD2. The antifuse circuit 1 may include at least one antifuse unit. Each of the antifuse units may receive a program mode signal "pgm" for determining whether or not the semiconductor device is in a program mode for programming the antifuse. Each of the antifuse units may also receive a plurality of selection signals "sel" for selecting an antifuse of among a plurality of antifuses to be programmed and programming each of the selected antifuses, or output an output signal RD depending on whether or nor each of the antifuses is programmed. The power-up signal generator 2 may output a power-up signal PRECH for sensing power stabilization to the antifuse circuit 1 after an external power supply voltage EVC is applied to a chip. The first and second pads PAD1 and PAD2 may receive a program voltage and a ground voltage through an NC ball NCB and a ground (GND) ball GNDB, respectively, and apply the program voltage and the ground voltage to the antifuse circuit 1. The GND ball GNDB and the second pad PAD2, which serve to apply a ground voltage Vss to the semiconductor device, may be included in an ordinary semiconductor device.

Figure 2:
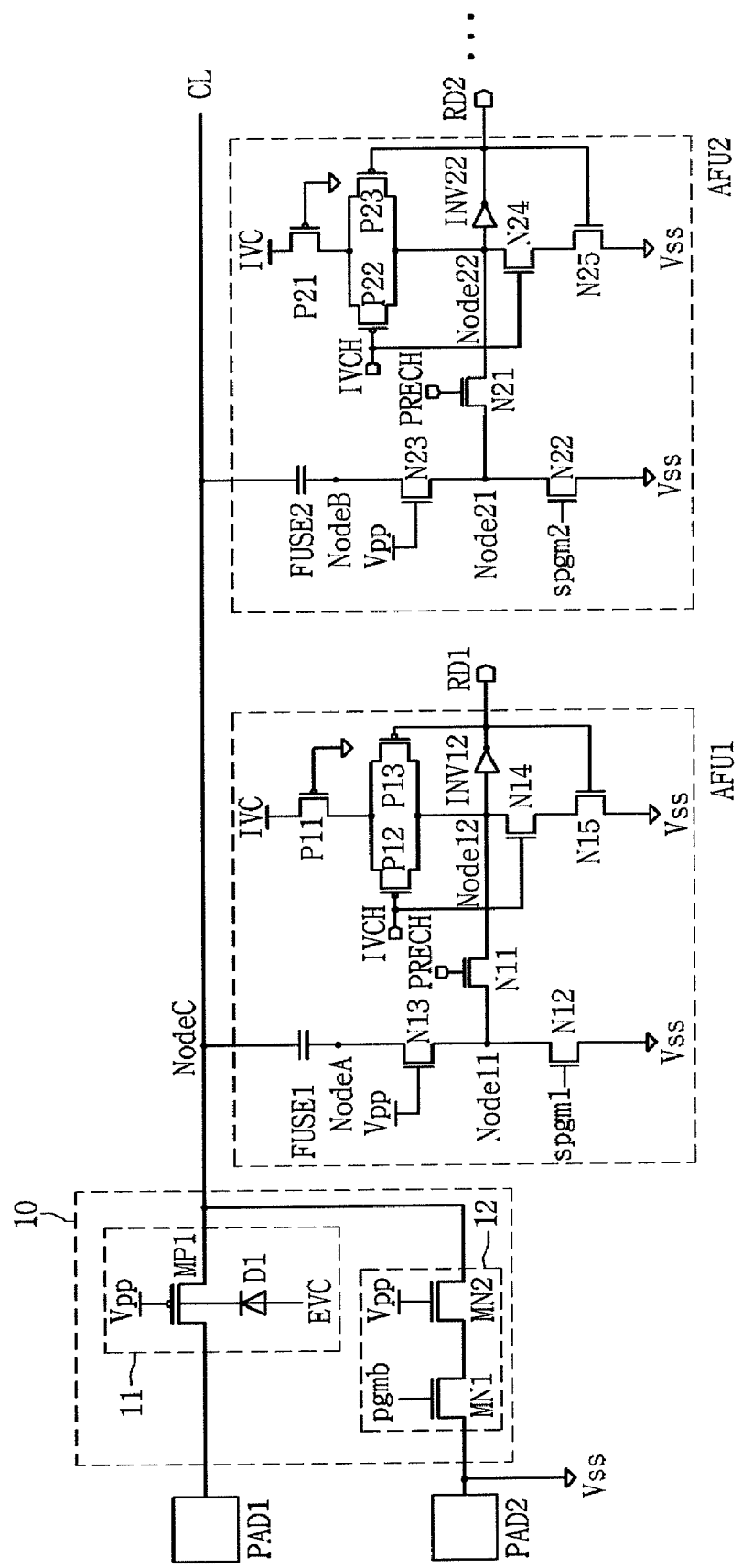
FIG. 2 is a diagram of the antifuse circuit of FIG. 1.

FIG. 2 is a diagram of the antifuse circuit of FIG. 1.

The antifuse circuit 1 of FIG. 2 may include at least one antifuse unit AFU1 and AFU2, each of which may include an antifuse. Each of the antifuse units AFU1 and AFU2 may be connected to a common line CL through a common node NodeC. The common line CL may be connected to the first and second pads PAD1 and PAD2, which receive a program voltage and a ground voltage Vss, through a protection circuit 10. The protection circuit 10 may include a first protection unit 11 and a second protection unit 12. The first protection unit 11 may include a PMOS transistor MP1 and a diode D1. The PMOS transistor MP1 may be connected between the first pad PAD1 and the common node NodeC and have a gate to which a boost voltage Vpp is applied. The diode D1 may be connected between an external power supply voltage EVC and a body of the PMOS transistor MP1. The second protection unit 12 may include two NMOS transistors MN1 and MN2, which may be connected in series between the second pad PAD2 and the common node NodeC and enabled in response to an inverted program mode signal pgmb and the boost voltage Vpp, respectively.

Operation of the protection circuit 10 will now be described with reference to FIG. 2. Initially, when the semiconductor device is not in a program mode, the program mode signal pgm may be disabled, and the inverted program mode signal pgmb may be enabled. Thus, both the two NMOS transistors MN1 and MN2 of the second protection unit 12 may be enabled, and the second pad PAD2 may be connected to the ground voltage Vss. Accordingly, a voltage level of the common node NodeC may reach a ground voltage level irrespective of a voltage applied to the first pad PAD1.

However, when the semiconductor device is in the program mode, the program mode signal "pgm" may be enabled, and the inverted program mode signal "pgmb" may be disabled. Thus, the second protection unit 12 may cut off the common node NodeC and the second pad PAD2. Also, when a program voltage higher than the boost voltage Vpp is applied through the first pad PAD1, the PMOS transistor MP1 of the first protection unit 11 may be turned on so that the program voltage can be applied to the common node NodeC. Thus, the program voltage may be applied through the common line CL to each of the antifuse units AFU1 and AFU2. Here, the program voltage may have a higher voltage level than that of the sum of the boost voltage Vpp and a threshold voltage of the PMOS transistor MP1. For example, when the boost voltage Vpp is 3V, the program voltage may be 5V or higher. Meanwhile, a power supply voltage may be typically applied as a bias voltage to a body of a PMOS transistor. Although FIG. 2 illustrates the external power supply voltage EVC applied to the body of the PMOS transistor MP1 as an example, an internal power supply voltage IVC may be applied to the body of the PMOS transistor MP1. When a higher voltage than a voltage applied to the gate of the PMOS transistor MP1 is applied a source of the PMOS transistor MP1 having the body to which the internal power supply voltage IVC or the external power supply voltage EVC is applied, a current path may be formed between the source and body of the PMOS transistor MP1 so that a noise may occur in the internal power supply voltage IVC or external power supply voltage EVC connected to the body of the PMOS transistor MP1. Accordingly, the diode D1 may prevent the program voltage from being applied through the body of the PMOS transistor MP1 to the internal power supply voltage IVC or external power supply voltage EVC.

Operation of each of the antifuse units AFU1 and AFU2 will now be described. In this description, it may be assumed that only a first antifuse FUSE1 of the antifuse units AFU1 and AFU2 is programmed. The antifuse units AFU1 and AFU2 may use NMOS transistors N11 and N21 as switch units, respectively. Thus, one of both terminals of each of the switch units, which includes a fuse, may be defined as a fuse unit, while the other of both the terminals may be defined as a latch unit.

The NMOS transistor N11 functioning as the switch unit may be switched between a fuse node Node11 and a latch node Node12 in response to the power-up signal PRECH. Also, the NMOS transistor N21 functioning as the switch unit may be switched between a fuse node Node21 and a latch node Node22 in response to the power-up signal PRECH. The power-up signal PRECH may be generated using the internal power supply voltage IVC. The power-up signal PRECH may rise with a rise in the internal power supply voltage IVC during an initial power supply period and be maintained constant at the same level as the internal power supply voltage IVC for a predetermined time when the internal power supply voltage IVC reaches a predetermined level and remains at the predetermined level. Thus, when the internal power supply voltage IVC is applied, the power-up signal PRECH may rise and remain at a predetermined level for a predetermined time so that current may flow from the latch nodes Node12 and Node22 to the fuse nodes Node11 and Node21.

Program selection signals spgm1 and spgm2, which are enabled in response to the program mode signal "pgm" of FIG. 1 and selection signals "sel" corresponding respectively to the antifuse units AFU1 and AFU2, may be applied to the fuse units. Specifically, the program selection signals spgm1 and spgm2 may be selectively enabled such that only the antifuse unit intended to be programmed is selected during a program operation. For example, when the semiconductor device is a semiconductor memory device, an address signal may be used as the selection signal "sel", and the program selection signals spgm1 and spgm2 may be enabled when both an address signal corresponding to each of the antifuse units AFU1 and AFU2 and the program mode are enabled.

Since it is assumed that only the first antifuse FUSE1 of the at least one antifuse unit AFU1 and AFU2 is programmed, only the program selection signal spgm1 may be enabled, while the program selection signal spgm2 may be disabled.

When the enabled program selection signal spgm1 is applied to a gate of an NMOS transistor N12, the NMOS transistor N12 may be turned on. Conversely, an NMOS transistor N22 may be turned off in response to the disabled program selection signal spgm2.

The program voltage may be applied to the common node NodeC, the NMOS transistor N12 may be turned on, and the NMOS transistor N13 may be permanently turned on in response to the boost voltage Vpp applied to a gate terminal thereof, and thus a voltage level of the first node NodeA may be to an internal ground voltage (Vss) level. As a result, a high voltage may be applied to both terminals of the first antifuse FUSE1 so that the first antifuse FUSE1 can be programmed. Since the NMOS transistor N22 of the second antifuse unit AFU2 remains turned off, a difference between voltages applied to both terminals of a second antifuse FUSE2 is not large. Accordingly, the second antifuse FUSE2 is not programmed.

In this case, even if high voltages are applied to the first and second pads PAD1 and PAD2, the NMOS transistors N13 and N23 connected between the fuse nodes Node11 and Node21 and first nodes NodeA and NodeB may prevent gate oxide layers of transistors constituting the respective antifuse units AFU1 and AFU2 from being damaged.

Operation of the antifuse units AFU1 and FU2 in which the first antifuse FUSE1 is programmed and the second antifuse FUSE2 is unprogrammed as described above will now be described. Initially, the latch units may precharge the latch nodes Node12 and Node22 using the internal power supply voltage IVC and latch voltages of the latch nodes Node12 and Node22.

The latch units may precharge the latch nodes Node12 and Node22 with a rise in the internal power supply voltage IVC during an initial power supply period. In this case, a power stabilization signal IVCH may be maintained at a low level during the rise in the internal power supply voltage IVC and make a transition to a high level when the internal power supply voltage IVC reaches a predetermined level. The power stabilization signal IVCH may then be maintained at the predetermined level. Since the power stabilization signal IVCH is at the low level during the initial power supply period, a current path may be formed through PMOS transistors P11 and P21 and PMOS transistors P12 and P22. Also, since the power-up signal PRECH rises with the rise in the internal power supply voltage IVC, current may be supplied through the PMOS transistors P11, P21, P12 and P22 and the NMOS transistors N11 and N21 to the fuse nodes Node11 and Node21. Gate terminals of the NMOS transistors N13 and N23 are connected to the boost voltage Vpp so that the current can flow to the antifuses FUSE1 and FUSE2.

Since the first antifuse FUSE1 of the first antifuse unit AFU1 is programmed and has a low resistance, current may flow from the fuse node Node11 through the first antifuse FUSE1 to the ground voltage Vss so that the voltage of the fuse node Node11 does not rise to a predetermined level or higher. Since the NMOS transistor N11 connects the fuse node Node11 with the latch node Node12 in response to the power-up signal PRECH, the voltage of the latch node Node12 may drop depending on the voltage of the fuse node Node11. When the internal power supply voltage IVC is stabilized, the power stabilization signal IVCH may be sent to a high level so that the PMOS transistor P12 may be turned off and the NMOS transistor N14 may be turned on. The voltage of the latch node Node12 may drop, and thus a second inverter INV12 may output a high-level signal. Thus, an NMOS transistor N15 may be turned on, and a PMOS transistor P13 may be turned off, so that the voltage of the latch node Node12 can be stabilized to a low level. In this case, since the NMOS transistor N14 remains turned on, it can be seen that the second inverter INV12, the PMOS transistor P13, and the NMOS transistor N15 may constitute a latch circuit.

Since the second antifuse FUSE2 of the second antifuse unit AFU2 is unprogrammed and has a high resistance, current does not flow from the fuse node Node21 through the second antifuse FUSE2 to the ground voltage Vss. Thus, the voltage of the fuse node Node21 may rise. Since the NMOS transistor N21 connects the fuse node Node21 with the latch node Node22 in response to the power-up signal PRECH, the voltage of the latch node Node22 may rise depending on the voltage of the fuse node Node21. When the internal power supply voltage IVC is stabilized, the power stabilization signal IVCH may be sent to a high level so that the PMOS transistor P22 may be turned off and an NMOS transistor N24 may be turned on. The voltage of the latch node Node22 may rise, and thus a second inverter INV22 may output a low-level signal. Thus, an NMOS transistor N25 may be turned off, and a PMOS transistor P23 may be turned on, so that the voltage of the latch node Node22 can be stabilized to a high level. In this case, since the NMOS transistor N24 remains turned on, it can be seen that the second inverter INV22, the PMOS transistor P23, and the NMOS transistor N25 may constitute a latch circuit.

Accordingly, when the antifuse FUSE1 of the first antifuse unit AFU1 is programmed and the antifuse FUSE2 of the second antifuse unit AFU2 is unprogrammed during the program operation, the first antifuse unit AFU1 may output a high-level output signal RD1, while the second antifuse unit AFU2 may output a low-level output signal RD2.

According to another exemplary embodiment of the present inventive concept, the at least one antifuse unit AFU1 and AFU2 of FIG. 2 may be constructed differently than the manner described above.

The protection circuit 10 may prevent application of a voltage other than the program voltage through the NC ball NCB to the antifuse circuit 1. A voltage other than the program voltage may be applied through the NC ball NCB to the semiconductor device. As described above, although the NC ball NCB, which is an extra ball for the semiconductor device, may be typically floated, some users may choose to apply the ground voltage Vss, the external power supply voltage EVC, or another voltage to the NC ball NCB. When the voltage other than the program voltage is applied to the antifuse circuit 1 through the first pad PAD1 connected to the NC ball NCB, antifuses FUSE1 and FUSE2 may be unintentionally programmed, and transistors of the respective antifuse units AFU1 and AFU2 may be damaged due to the programmed antifuses FUSE1 and FUSE2.

As described above, when the semiconductor device is not in the program mode, the common node NodeC may be maintained at the ground voltage (Vss) level due to the second protection unit 12. Thus, even if a voltage other than the program voltage is applied to the first pad PAD1, antifuse units AFU1 and AFU2 may be protected from unintentional programming. However, when the voltage other than the program voltage is applied to the first pad PAD1 in the program mode, for example, due to a user's malfunction or mistake, the first protection unit 11 may inhibit the voltage applied to the first pad PAD1 from being applied to the common node NodeC. There are few cases where a voltage higher than a level (e.g., 1.8V) of the external power supply voltage EVC or a voltage lower than the ground voltage Vss is applied to the semiconductor device, except for a voltage for enabling a special operation, such as the program voltage for programming the antifuse. Accordingly, the PMOS transistor MP1 of the first protection unit 11 should prevent application of the external power supply voltage EVC, the ground voltage Vss, and a voltage having an intermediate level between the external power supply voltage EVC and the ground voltage Vss to the common node NodeC in program mode. In FIG. 2, since the boost voltage Vpp higher than the external power supply voltage EVC is applied to the gate of the PMOS transistor MP1 of the first protection unit 11, the first protection unit 11 may inhibit application of a voltage lower than the boost voltage Vpp to the common node NodeC.

Figure 3:
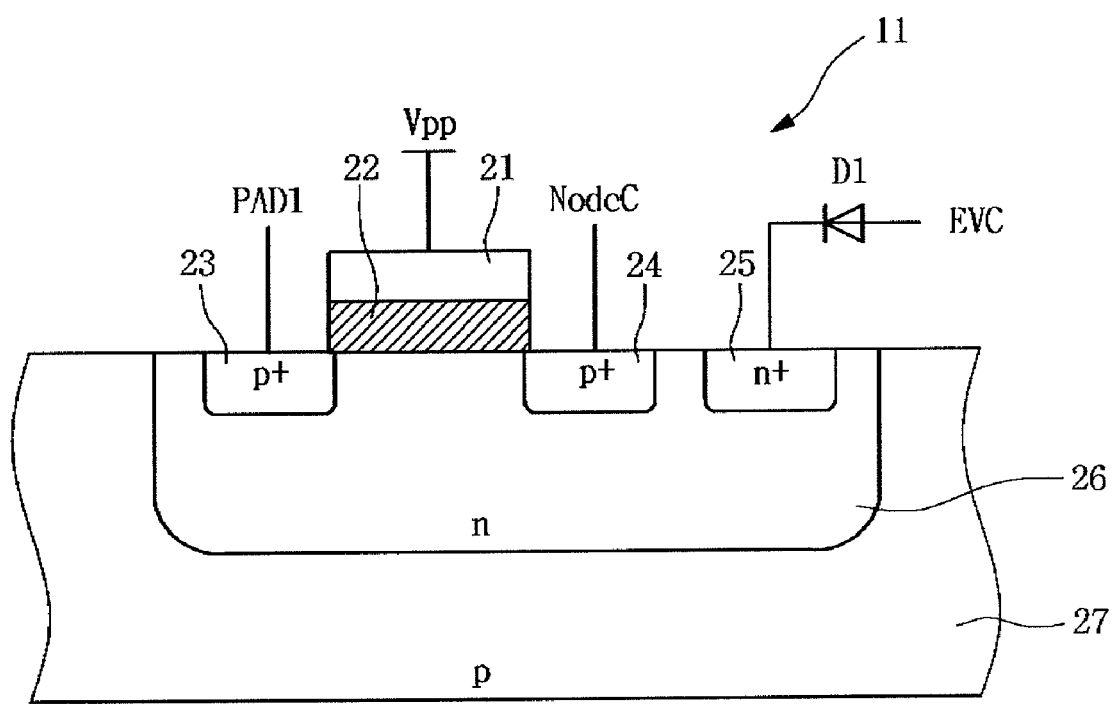
FIG. 3 is a cross-sectional view of a protection circuit of FIG. 2.

FIG. 3 is a cross-sectional view of the first protection unit of FIG. 2.

The PMOS transistor MP1 of the first protection unit 11 may include a p-type substrate 27, an n-type well 26, a p-type source 23, a p-type drain 24, a dielectric material 22, a gate 21, and an n-type well electrode 25. The n-type well 26 may be formed in a predetermined region of the substrate 27 and function as the body of the PMOS transistor MP1. The p-type source 23 and the p-type drain 24 may be formed in the n-type well 26 to be spaced apart from each other. The dielectric material 22 may be formed on the substrate 27 between the source 23 and the drain 24. The gate 21 may be formed on the dielectric material 22. The n-type well electrode 25 may be used to apply a bias voltage to the n-type well 26. The gate 21 may receive the boost voltage Vpp, and the n-type well electrode 25 may apply the external power supply voltage EVC as a bias voltage through the diode D1 to the body of the PMOS transistor MP1.

Operation of the first protection unit 11 will now be described with reference to FIG. 3. Initially, when the program voltage is applied to the source of the PMOS transistor MP1, since the program voltage is higher than the boost voltage Vpp, the PMOS transistor MP1 may be turned on so that the program voltage can be applied to the common node NodeC. In this case, since the source 23 and the well 26 form a PN junction diode, a voltage having a voltage level obtained by subtracting a threshold voltage of the PN junction diode from the program voltage may be applied to the well 26. Although the well 26 receives a voltage obtained by subtracting a threshold voltage of the diode D1 from the external power supply voltage EVC through the well electrode 25, the program voltage applied to the well 26 is not applied to the external power supply voltage EVC by the diode D1. Thus, the external power supply voltage EVC is not affected by the program voltage that is a high voltage.

When a voltage lower than the boost voltage Vpp is applied to the source of the PMOS transistor MP1 through the first pad PAD1, the PMOS transistor MP1 may be turned off. When the ground voltage Vss is applied to the first pad PAD1, a voltage obtained by subtracting the threshold voltage of the diode D1 from the external power supply voltage EVC may be applied through the well electrode 25 to the well 26 of the PMOS transistor MP1. By comparison, when the external power supply voltage EVC is applied to the first pad PAD1, not only the voltage obtained by subtracting the threshold voltage of the diode D1 from the external power supply voltage EVC but also a voltage obtained by subtracting the threshold voltage of the diode formed by the source 23 and the well 26 from the external power supply voltage EVC may be applied through the well electrode 25 to the well 26 of the PMOS transistor MP1. However, the voltage applied to the well 26 is not applied to the outside of the first protection unit 11 because the source 23 (or the drain 24) and the well 26 form the PN junction diode and the well electrode 25 is connected to the diode D1. As a result, the first pad PAD1 and the common node NodeC may be cut off from each other so that the voltage applied to the first pad PAD1 cannot be transmitted to the common node NodeC. Accordingly, antifuse units AFU1 and AFU2 connected to the common node NodeC is not affected.

Although FIGS. 2 and 3 illustrate the external power supply voltage EVC applied through the diode D1 to the body of the PMOS transistor MP1, the internal power supply voltage IVC may be applied as a bias voltage.

The construction of the at least one antifuse unit AFU1 and AFU2 may be variously changed, and levels of respective signals and voltages may be changed according to the design of the antifuse circuit 1.

Therefore, an antifuse circuit having a protection circuit according to exemplary embodiments of the present inventive concept can apply a program voltage using an NC pin or NC ball that is not used in a semiconductor device, thereby facilitating a repair operation even after a packaging process. Also, the protection circuit can prevent an unintended voltage lower than the program voltage from being applied to the antifuse.

The foregoing is illustrative of exemplary embodiments of the present inventive concept and is not to be construed as limiting thereof.

What is claimed is:
1. An antifuse circuit comprising:
   a protection circuit including a first protection unit connected between a first pad and a common node of a common line, and configured to apply a program voltage, received from the first pad, to the common node when the program voltage is higher than a boost voltage and the first protection unit is configured to prevent application of the program voltage to the common node when the program voltage is lower than the boost voltage; and at least one antifuse unit connected to the protection circuit along the common line, each of the at least one antifuse unit including an antifuse, and configured to program the antifuse with the program voltage in response to a selection signal and a program mode signal in a program mode and output an output signal according to a program state of the antifuse in a normal mode, wherein the first protection unit comprises:

a PMOS transistor connected between the first pad and the common node and having a gate to which the boost voltage is applied; and a diode connected between a body of the PMOS transistor and a power supply voltage that is lower than the boost voltage.

2. The antifuse circuit of claim 1, wherein the PMOS transistor comprises:

a p-type substrate;

an n-type well disposed in a predetermined region of the p-type substrate;

a p-type source and a p-type drain disposed in first and second predetermined regions of the n-type well, respectively, the p-type source and the p-type drain being spaced apart from each other;

an n-type well electrode disposed in a third predetermined region of the n-type well, the n-type well electrode being spaced apart from the p-type source and p-type drain, and connected to a cathode of the diode;

a dielectric material disposed on the n-type well between the p-type source and the p-type drain; and the gate disposed on the dielectric material, and configured to receive the boost voltage.

3. The antifuse circuit of claim 1, wherein the protection circuit further comprises a second protection unit connected between a second pad and the common node, and configured to apply a ground voltage to the common node in response to an inverted program mode signal in the normal mode and prevent application of the ground voltage to the common node in the program mode.

4. The antifuse circuit of claim 3, wherein the second protection unit comprises two NMOS transistors serially connected between the second pad and the common node and configured to receive the boost voltage and the inverted program mode signal, respectively.

5. The antifuse circuit of claim 3, wherein the first pad is connected to a non-connection (NC) pin or NC ball of a semiconductor device including the antifuse circuit, and the second pad is connected to a ground (GND) pin or GND ball configured to apply the ground voltage to the semiconductor device.

6. The antifuse circuit of claim 1, wherein each of the at least one antifuse unit comprises:

a fuse unit having a corresponding antifuse connected between the common node and a first node, and configured to be enabled in response to a corresponding program selection signal, which is enabled in response to the program mode signal and the corresponding selection signal, and to program the corresponding antifuse in response to the program voltage applied to the common node to set a voltage level of a fuse node;

a switch transistor configured to connect the fuse node with a latch node in response to a power-up signal; and a latch unit configured to be enabled in response to a power stabilization signal, and latch and output the output signal in response to a voltage level of the latch node.

7. A semiconductor device comprising:

an antifuse circuit; and a plurality of pins or balls for connecting the semiconductor device to an external circuit that contains an external apparatus for supplying an antifuse program voltage, wherein a non-connection (NC) pin or ball of the plurality of pins or balls is connected to a first pad of the antifuse circuit and is configured to deliver the antifuse program voltage from the external apparatus to the antifuse circuit, the antifuse circuit comprising: a protection circuit including a first protection unit connected between the first pad and a common node of a common line, and configured to apply the antifuse program voltage, received from the first pad, to the common node when the antifuse program voltage is higher than a boost voltage and the first protection unit is configured to prevent application of the antifuse program voltage to the common node when the antifuse program voltage is lower than the boost voltage; and at least one antifuse unit, connected to the protection circuit along the common line, each of the at least one antifuse unit including an antifuse, and configured to program the antifuse with the program voltage in response to a selection signal and a program mode signal in a program mode and output an output signal according to a program state of the antifuse in a normal mode.

8. The semiconductor device of claim 7, wherein the first protection unit comprises:

a PMOS transistor connected between the first pad and the common node, comprising a gate to which the boost voltage is applied, a p-type substrate, an n-type well disposed in a predetermined region of the p-type substrate, a p-type source and a p-type drain disposed in first and second predetermined regions of the n-type well, respectively, the p-type source and the p-type drain being spaced apart from each other, an n-type well electrode disposed in a third predetermined region of the n-type well, the n-type well electrode being spaced apart from the p-type source and p-type drain, and connected to a cathode of a diode, a dielectric material disposed on the n-type well between the p-type source and the p-type drain, and the gate disposed on the dielectric material, and configured to receive the boost voltage; and the diode connected between a body of the PMOS transistor and a power supply voltage that is lower than the boost voltage.

9. The semiconductor device of claim 7, wherein the protection circuit further comprises a second protection unit connected between a second pad of the antifuse circuit and the common node, and configured to apply a ground voltage to the common node in response to an inverted program mode signal in the normal mode and prevent application of the ground voltage to the common node in the program mode.

10. The semiconductor device of claim 9, wherein the second protection unit comprises two NMOS transistors serially connected between the second pad and the common node and configured to receive the boost voltage and the inverted program mode signal, respectively.

11. The semiconductor device of claim 9, wherein the second pad is connected to a ground (GND) pin or GND ball of the plurality of pins or balls and is configured to apply the ground voltage to the semiconductor device.

12. The semiconductor device of claim 7, wherein each of the at least one antifuse unit comprises:
- a fuse unit having a corresponding antifuse connected between the common node and a first node, and configured to be enabled in response to a corresponding program selection signal, which is enabled in response to the program mode signal and the corresponding selection signal, and to program the corresponding antifuse in response to the antifuse program voltage applied to the common node to set a voltage level of a fuse node;
- a switch transistor configured to connect the fuse node with a latch node in response to a power-up signal; and
- a latch unit configured to be enabled in response to a power stabilization signal, and latch and output the output signal in response to a voltage level of the latch node.

13. A semiconductor device comprising:
an antifuse circuit; and
a plurality of pins or balls for connecting the semiconductor device to an external circuit that contains an external apparatus for supplying an antifuse program voltage, wherein a non-connection (NC) pin or ball of the plurality of pins or balls is connected to a first pad of the antifuse circuit and is configured to deliver the antifuse program voltage from the external apparatus to the antifuse circuit, the antifuse circuit comprising: a protection circuit including a first protection unit connected between the first pad and a common node of a common line, and configured to apply the antifuse program voltage, received from the first pad, to the common node when the antifuse program voltage is higher than a boost voltage and the first protection unit is configured to prevent application of the antifuse program voltage to the common node when the antifuse program voltage is lower than the boost voltage; and
at least one antifuse unit, connected to the protection circuit along the common line, each of the at least one antifuse unit including an antifuse, and configured to program the antifuse in response to a selection signal and a program mode signal in a program mode and output an output signal according to a program state of the antifuse in a normal mode, wherein the first protection unit comprises: a PMOS transistor connected between the first pad and the common node, comprising a gate to which the boost voltage is applied, a p-type substrate, an n-type well disposed in a predetermined region of the p-type substrate, a p-type source and a p-type drain disposed in first and second predetermined regions of the n-type well, respectively, the p-type source and the p-type drain being spaced apart from each other, an n-type well electrode disposed in a third predetermined region of the n-type well and functioning as a body of the PMOS transistor, the n-type well electrode being spaced apart from the p-type source and p-type drain, and connected to a cathode of a diode, the n-type well electrode being used to apply a bias voltage to the n-type well, a dielectric material disposed on the n-type well between the p-type source and the p-type drain, and the gate disposed on the dielectric material, and configured to receive the boost voltage; and
the diode connected between the body of the PMOS transistor and an external power supply voltage that is lower than the boost voltage, wherein the n-type well electrode applies the external power supply voltage as the bias voltage through the diode to the body of the PMOS transistor.

14. The semiconductor device of claim 13, wherein the protection circuit further comprises a second protection unit connected between a second pad of the antifuse circuit and the common node, and configured to apply a ground voltage to the common node in response to an inverted program mode signal in the normal mode and prevent application of the ground voltage to the common node in the program mode.

15. The semiconductor device of claim 14, wherein the second protection unit comprises two NMOS transistors serially connected between the second pad and the common node and configured to receive the boost voltage and the inverted program mode signal, respectively.

16. The semiconductor device of claim 14, wherein and the second pad is connected to a ground (GND) pin or GND ball of the plurality of pins or balls and is configured to apply the ground voltage to the semiconductor device.

17. The semiconductor device of claim 13, wherein each of the at least one antifuse unit comprises:
- a fuse unit having a corresponding antifuse connected between the common node and a first node, and configured to be enabled in response to a corresponding program selection signal, which is enabled in response to the program mode signal and the corresponding selection signal, and to program the corresponding antifuse in response to the antifuse program voltage applied to the common node to set a voltage level of a fuse node;
- a switch transistor configured to connect the fuse node with a latch node in response to a power-up signal; and
- a latch unit configured to be enabled in response to a power stabilization signal, and latch and output the output signal in response to a voltage level of the latch node.

* * * * *